United States Patent
Kim et al.

(10) Patent No.: US 11,288,183 B2
(45) Date of Patent: *Mar. 29, 2022

(54) OPERATING METHOD OF MEMORY SYSTEM AND HOST RECOVERING DATA WITH WRITE ERROR

(71) Applicant: SAMSUNG ELECTRONICS CO., LTD., Suwon-si (KR)

(72) Inventors: Dongjin Kim, Hwaseong-si (KR); Suman Prakash Balakrishnan, Bangalore (IN); Seokhwan Kim, Seoul (KR); Chansol Kim, Hwaseong-si (KR); Eunhee Rho, Seoul (KR); Jaeyoon Choi, Seoul (KR); Hyejeong Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

This patent is subject to a terminal disclaimer.

(21) Appl. No.: 16/858,959

(22) Filed: Apr. 27, 2020

(65) Prior Publication Data

US 2021/0103517 A1    Apr. 8, 2021

(30) Foreign Application Priority Data

Oct. 4, 2019    (KR) .................. 10-2019-0123347

(51) Int. Cl.
| | |
|---|---|
| *G06F 12/02* | (2006.01) |
| *G06F 3/06* | (2006.01) |
| *G11C 29/52* | (2006.01) |
| *G06F 11/10* | (2006.01) |
| *G11C 29/04* | (2006.01) |

(52) U.S. Cl.
CPC ........ *G06F 12/0246* (2013.01); *G06F 3/0659* (2013.01); *G06F 3/0679* (2013.01); *G06F 11/1048* (2013.01); *G06F 11/1068* (2013.01); *G11C 29/52* (2013.01); *G11C 2029/0411* (2013.01)

(58) Field of Classification Search
CPC .. G06F 11/1048; G06F 3/0619; G06F 3/0656; G06F 3/0659; G06F 11/1068; G06F 3/0679; G06F 12/0246; G11C 2029/0411; G11C 2029/0409; G11C 29/52
See application file for complete search history.

(56) References Cited

U.S. PATENT DOCUMENTS

| | | | |
|---|---|---|---|
| 6,104,651 | A | 8/2000 | Cowles et al. |
| 7,263,013 | B2 | 8/2007 | Kim |
| 7,944,773 | B2 | 5/2011 | Wong et al. |
| RE44,218 | E | 5/2013 | Im et al. |
| 8,687,459 | B2 | 4/2014 | Wong et al. |
| 8,804,447 | B2 | 8/2014 | Im et al. |

(Continued)

*Primary Examiner* — Guy J Lamarre
(74) *Attorney, Agent, or Firm* — Sughrue Mion, PLLC

(57) ABSTRACT

A method of operating a memory system including a memory device, including in response to a write request of a host, storing write data and a physical address received from the host in a buffer; performing a write operation on the memory device based on the write data and the physical address; based on a write error corresponding to the write data occurring, asynchronously providing the host with error occurrence information; and providing the host with the write data having the write error and information used for a recovery from the write error.

20 Claims, 14 Drawing Sheets

(56) References Cited

U.S. PATENT DOCUMENTS

| | | |
|---|---|---|
| 8,917,568 B2 | 12/2014 | Chen et al. |
| 9,304,946 B2 | 4/2016 | Solihin |
| 9,557,937 B2 | 1/2017 | Gupta et al. |
| 9,710,377 B1 | 7/2017 | Kuzmin et al. |
| 9,727,454 B2 | 8/2017 | Kuzmin et al. |
| 9,886,383 B2 | 2/2018 | Cohen et al. |
| 11,157,357 B2* | 10/2021 | Kim ........................ G06F 12/10 |
| 2014/0215154 A1 | 7/2014 | Stewart et al. |
| 2014/0365719 A1* | 12/2014 | Kuzmin .............. G06F 12/0246 711/103 |
| 2018/0011762 A1 | 1/2018 | Klein |
| 2020/0117373 A1* | 4/2020 | Sheperek .............. G06F 3/0659 |
| 2021/0103495 A1* | 4/2021 | Kim ................... G06F 12/0253 |

\* cited by examiner

OPERATING METHOD OF MEMORY SYSTEM AND HOST RECOVERING DATA WITH WRITE ERROR

CROSS-REFERENCE TO THE RELATED APPLICATION

This application is based on and claims priority under 35 U.S.C. § 119 to Korean Patent Application No. 10-2019-0123347, filed on Oct. 4, 2019, in the Korean Intellectual Property Office, the disclosure of which is incorporated by reference herein in its entirety.

BACKGROUND

1. Field

The present disclosure relates to a memory system, a host, and an operating method thereof, and more particularly, to a memory system and a host recovering data with a write error, and an operating method thereof.

2. Description of Related Art

A memory system may include a normal Solid State Drive (SSD) that includes a flash translation layer (FTL) or an open channel SSD that does not include an FTL. The open channel SSD may not support an address mapping function of mapping a logical address to a physical address of a storage device, and thus may allow a host to process a write error that occurs therein.

SUMMARY

Provided are a memory system, a host, and an operating method thereof, wherein the memory system generates information for recovering data with a write error, and the host performs recovery on the basis of the generated information, thereby improving reliability and efficiency.

According to an embodiment, a method of operating a memory system including a memory device includes in response to a write request of a host, storing write data and a physical address received from the host in a buffer; performing a write operation on the memory device based on the write data and the physical address; based on a write error corresponding to the write data occurring, asynchronously providing the host with error occurrence information; and providing the host with the write data having the write error and information used for a recovery from the write error.

According to an embodiment, method of operating a host configure to control a memory system includes based on write data and a physical address, transmitting a first write request to the memory system; asynchronously acquiring, from the memory system, error occurrence information about a write error corresponding to the write data occurring in the memory system; acquiring the write data having the write error and information used for a recovery from the write error from the memory system; based on the write data having the write error and the information used for the recovery from the write error, recovering the write data having the write error; and based on the recovered write data, transmitting a second write request to the memory system.

According to an embodiment, computing system includes memory system comprising a memory device; and a host configured to transmit a write request to the memory system based on write data and a physical address, wherein the memory system, in response to the write request of the host, is configured to: store the write data and the physical address received from the host in a buffer of the memory system, perform a write operation on the memory device based on the write data and the physical address, based on a write error corresponding to the write error occurring, asynchronously provide the host with error occurrence information, and provide the host with the write data having the write error and information used for a recovery from the write error, and wherein the host is configured to: recover the write data having the write error based on the write data having the write error and the information used for the recovery from the write error, and transmit a recovery command to the memory system based on the recovered write data.

BRIEF DESCRIPTION OF THE DRAWINGS

Embodiments of disclosure will be more clearly understood from the following detailed description taken in conjunction with the accompanying drawings in which.

DETAILED DESCRIPTION

Figure 1:
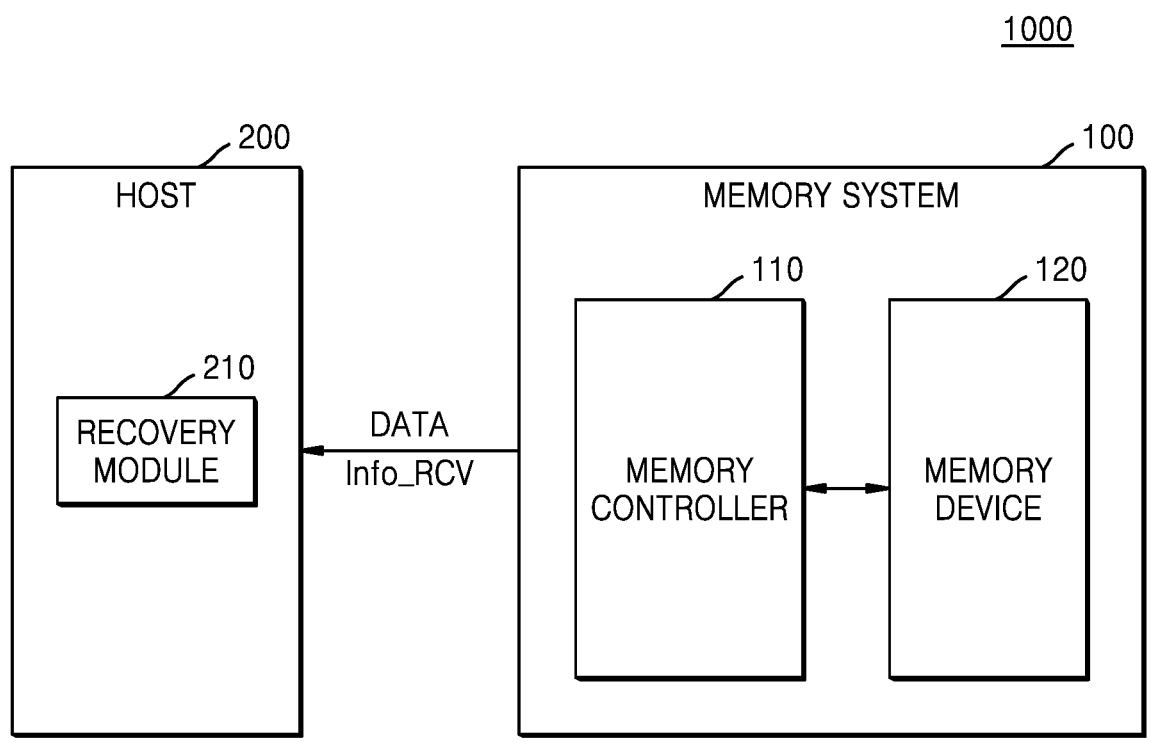
FIG. 1 is a block diagram of a computing system according to an embodiment.

FIG. 1 is a block diagram of an example of a computing system according to an embodiment.

Referring to FIG. 1, a computing system 1000 may include a memory system 100 and a host 200. The computing system 1000 may be various types of systems in which the memory system 100 storing data is mounted. For example, the computing system 1000 may correspond to various types of systems such as a computer, a netbook, a web tablet, a wireless phone, a mobile phone, a smartphone, an e-book, a navigation device, a digital camera, a wearable device, an internet of things (IoT) device, an internet of everything (IoE) device, a virtual reality (VR) device, an augmented reality (AR) device, and the like.

The memory system 100 may include a memory controller 110 and a memory device 120. The memory system 100 may include one or more storage media. For example, the memory system 100 may include one or more solid state drives (SSDs). In addition, the memory system 100 may include one or more open channel SSDs. Here, an open channel SSD may refer to an SSD that does not include a flash translation layer (FTL). The open channel SSD may not include the FTL capable of mapping a logical address provided by a host to a physical address of a storage device and thus may not directly manage addresses. Therefore, the open channel SSD may receive a physical address, not a logical address, from the host 200 to perform write/read/erase operations and the like. In addition, even if an error occurs in the storage device, the open channel SSD may not randomly store recovered data in another address and thus may perform a recovering operation through the host 200. According to an embodiment, the open channel SSD may include mapping information that defines a relationship between the logical address provided by the host and the physical address of the storage device. However, the open channel SSD may not directly manage addresses by using the mapping information.

The host 200 may provide the memory system 100 with an access request for data. For example, the host 200 may provide the memory system 100 with a write request or a read request for data, and the memory system 100 may write data to the memory device 120 or read data from the memory device 120 and provide the host 200 with the data, based on the access request of the host 200. In addition, based on an erase request for data of the host 200, the memory system 100 may perform an erase operation on data in a region instructed by the host 200.

When the memory system 100 is a normal SSD, the host 200 may commonly provide the memory system 100 with an access request on the basis of a logical address. However, when the memory system 100 is an open channel SSD or the host 200 includes mapping information that defines a relationship between a logical address and a physical address of the memory device 120, the host 200 may provide the memory system 100 with an access request on the basis of the physical address of the memory system 100. For example, the host 200 may determine a physical address by using the mapping information and provide the memory system 100 with the access request on the basis of the determined physical address. In addition, the memory system 100 may perform a write operation, a read operation, or an erase operation on the basis of the physical address received from the host 200.

The host 200 may include a recovery module 210. The recovery module 210 may be embodied as various types to be included in the host 200. For example, the recovery module 210 may be hardware (HW) such as a circuit or the like for performing various types of processing associated with a recovery of data with an error. In an embodiment, the recovery module 210 may as software (SW) including a program, and a processing unit in the host 200 may execute the recovery module 210 loaded into an operating memory to perform various types of processing associated with a recovery of data with an error. Otherwise, the recovery module 210 may be a combination of HW and SW.

The recovery module 210 may support a function of recovering data with an error. As an example, when the memory system 100 detects an error during a process of writing data at the access request of the host 200 and transmits write data DATA with a write error and information used for a recovery Info_RCV to the host 200, the recovery module 210 may perform a recovery of the data with the error on the basis of the write data DATA with the write error and the information used for the recovery Info_RCV.

For example, the host 200 may provide a write request on the basis of the physical address determined by using the mapping information of the memory system 100, or a logical address according to an embodiment, and the write data. The memory system 100 may store the write data and the physical address, or a logical address according to an embodiment, received from the host 200 in a buffer in response to the write request. In addition, the memory system 100 may perform a write operation on the memory device 120 on the basis of the write data and the physical address, or the logical address according to the embodiment. When a write error occurs in this process, the memory system 100 may notify the host 200 of the occurrence of the write error by providing the host 200 with error occurrence information about the write error in an asynchronous mode. Here, the asynchronous mode may refer to a mode in which, when a preset event is detected, the memory system 100 performs a particular operation without a request of the host 200. Also, the memory system 100 may provide the host 200 with the write data DATA with the write error and the information used for the recovery Info_RCV. In addition, the recovery module 210 may recover write data by using the write data DATA with the write error and the information used for the recovery Info_RCV acquired from the memory system 100. Moreover, the host 200 may generate a new write request on the basis of the write data recovered through the recovery module 210 and provide the memory system 100 with the write request.

According to the above-described embodiment, even if the memory system 100 is a normal SSD and thus may independently perform a recovery from a write error, the memory system 100, when performing a recovery operation, may use the host 200 having many operation resources. Therefore, when many other operations are performed in the memory system 100, a performance improvement of the memory system 100 may be achieved.

Also, even if the memory system 100 is an open channel SSD which may not directly manage addresses, randomly store recovered data in another address, and independently perform a recovery from a write error, the memory system 100 may perform a recovery operation through the recovery module 210 of the host 200 that manages the mapping information of the memory system 100. In addition, since the memory system 100, not the host 200, generates information used for a recovery from a write error, utilization of the resources of the host 200 may be increased. Hereinafter, a more detailed operation of the memory system 100 that is an open channel SSD will be described.

Figure 2:
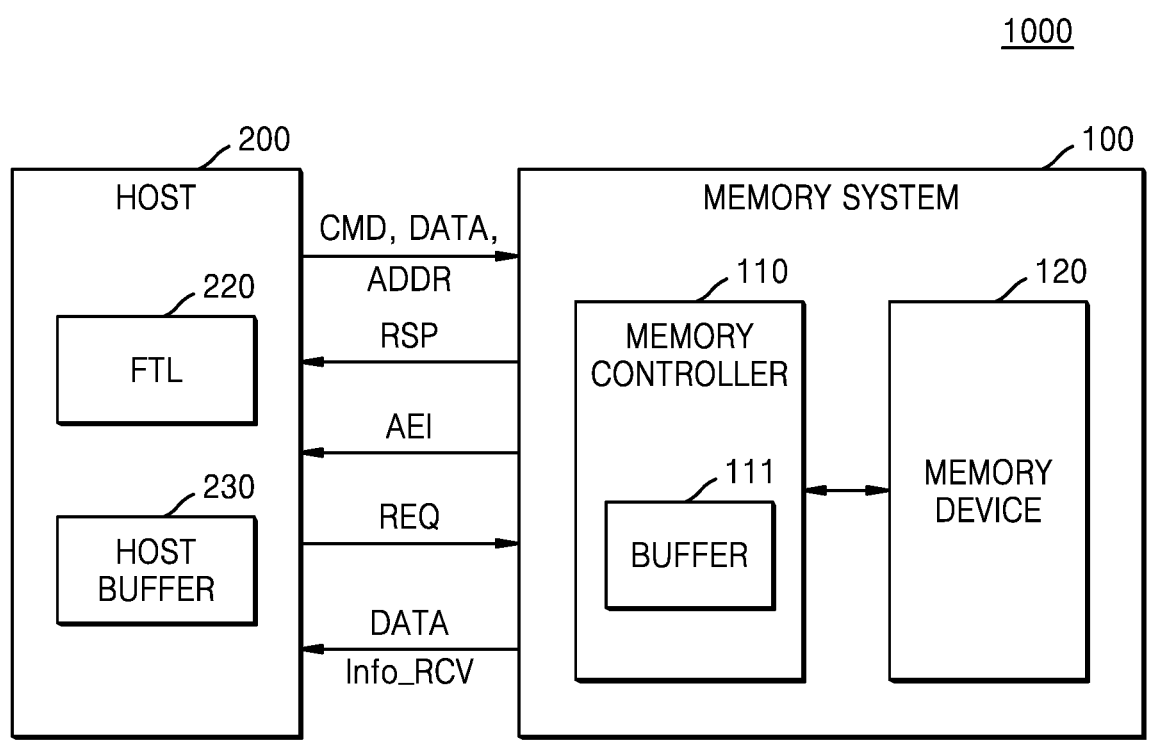
FIG. 2 is a block diagram illustrating an example of the computing system of FIG. 1, according to an embodiment.

FIG. 2 is a block diagram illustrating an example of an embodiment of the computing system 1000 of FIG. 1.

Referring to FIGS. 1 and 2, the memory system 100 may be an open channel SSD and may include a buffer 111, and the host 200 may include an FTL 220 and a host buffer 230.

The FTL 220 of the host 200 may manage write/read/erase operations of the memory system 100 by using the mapping information of the memory system 100. Also, the FTL 220 may perform an address mapping function of mapping a logical address used by the host 200 to a physical address of the memory device 120 and a garbage collection function.

According to an embodiment, a recovery module may be included in the FTL 220. In addition, the FTL 220 may recover from an error occurring in the memory system 100 by using the recovery module while managing the write/read/erase operations of the memory system 100.

The FTL 220 may be SW such as firmware, an operating system, or an application driven by a processing unit. In an embodiment, the FTL 220 may HW such as a circuit or the like for performing various types of processing associated with a management of the memory system 100. In an embodiment, the FTL 220 may be a combination of HW and SW.

The host 200 may convert the logical address into the physical address of the memory device 120 through the FTL 220 and transmit a write command CMD, write data DATA, and a physical address ADDR to the memory system 100.

Here, the host 200 may allocate the host buffer 230 to store the write data DATA and the physical address ADDR transmitted to the memory system 100. The host buffer 230 may temporarily store the write data DATA and the physical address ADDR in an access process of the host 200 to the memory system 100.

In addition, the memory controller 110 may store the received write data DATA and physical address ADDR in the buffer 111. The buffer 111 may temporarily store the write data DATA and the physical address ADDR received from the host 200 in a process of performing a write operation. Also, when completing the storing of the write data DATA and the physical address ADDR in the buffer 111, the memory controller 110 may transmit a response signal RSP to the host 200. In addition, when the host 200 receives the response signal RSP from the memory system 100, the write data DATA and the physical address ADDR corresponding thereto may be deallocated from the host buffer 230.

Before performing a write operation on the basis of the write data DATA and the physical address ADDR stored in the buffer 111, the memory controller 110 may generate information used for a recovery in preparation for an error that may subsequently occur. For example, the memory controller 110 may generate an Error Correcting Code (ECC) parity on the basis of received write data or may generate a recovery parity of pieces of write data DATA in a recovery unit according to a Redundant Array of Inexpensive Disk (RAID) scheme. The information used for the recovery may not be limited to the example described above, and thus, various types of information may be generated.

Also, the memory controller 110 may write the write data DATA and generated parity information to the memory device 120. For example, the memory controller 110 may write the generated ECC parity and/or recovery parity in the same area or different areas of the write data and the memory device 120. Also, the memory controller 110 may generate a directory including physical address information of an area in which generated parity is stored. In addition, according to an embodiment, the memory controller 110 may share the generated directory with the host 200.

Moreover, the memory controller 110 may check whether a write error occurs. For example, the memory controller 110 may program write data DATA and a generated parity and perform a program verification to check whether the write error occurs. In an embodiment, the memory controller 110 may check whether a write error occurs, by randomly generating a read command to read write data DATA and checking error bits within the read data. A method of checking whether a write error occurs is not limited to the example described above.

Also, when a write error occurs, the memory controller 110 may transmit Asynchronous Event Information (AEI) to the host 200. Here, the AEI may refer to information that notifies an occurrence of an error in the memory system 100 in an asynchronous mode. For example, the AEI may include a physical address of write data DATA with a write error.

In addition, the memory controller 110 may read the write data DATA with the write error and the information used for the recovery Info_RCV from the buffer 111 or the memory device 120. Here, the information used for the recovery Info_RCV may include the ECC parity of the write data DATA with the write error and/or the recovery parity and may further include normal data within a recovery unit in which the write error occurs. Examples of this will be described in detail later with reference to FIG. 6. Also, the information used for the recovery Info_RCV may include metadata. The metadata may include various information used to manage the memory system 100. For example, the metadata may include mapping information defining a relationship between the logical address and the physical address of the memory device 120, physical block information indicating information of pages included in each physical block of the memory device 120, attribute information indicating validity or invalidity of data, a directory indicating a physical address of the mapping information, the physical block information, or parity information stored in the memory device 120, and the like. The information used for the recovery Info_RCV is not limited to the example described above.

The host 200 may transmit a request signal REQ for requesting information associated with an error to the memory controller 110. For example, when acquiring the AEI from the memory controller 110, the host 200 may transmit the request signal REQ for requesting the information associated with the error to the memory controller 110. Also, the memory controller 110 may provide the host 200 with the write data DATA and the information used for the recovery Info_RCV that are pre-read.

A read operation of the memory controller 110 reading the write data DATA and the information used for the recovery Info_RCV may be performed after receiving the request signal REQ from the host 200. Here, the request signal REQ may be a signal that simply requests information associated with an error. In this case, when receiving the request signal REQ, the memory controller 110 may read the write data from the buffer 111 and check a physical address of information used for a recovery Info_RCV on the basis of directory information to read the information used for the recovery from the memory device 120. In an embodiment, the request signal REQ may include the physical address of the information used for the recovery. In this case, the memory controller 110 may read the write data from the buffer 111 and read the information used for the recovery Info_RCV from the memory device 120 on the basis of the physical address within the request signal REQ.

The memory controller 110 may be provide the write data DATA and the information used for the recovery Info_RCV when providing the AEI, regardless of whether the request signal REQ is received from the host 200.

Also, the host 200 may perform a recovery of write data having a write error through the FTL 220 and the recovery module. For example, the host 200 may recover write data by using the write data DATA with the write error and the information used for the recovery Info_RCV, determine a new physical address by using the mapping information of the memory system 100, generate a write request on the basis of the new physical address and the recovered write data, and provide the memory system 100 with the write request.

According to the embodiment described above, when receiving the response signal RSP, the host 200 may deallocate the write data DATA and the physical address ADDR from the host buffer 230, thereby terminating synchronization between the host 200 and the memory system 100 in association with a write operation. An actual write operation of the memory system 100 may be performed separately from the host 200. In addition, when a write error occurs during the actual write operation, the memory system 100 may notify the host 200 of the occurrence of the write error in an asynchronous mode, thereby recovering the write error. Therefore, because the host 200 may not need to allocate the write data DATA and the physical address ADDR to the host buffer 230 until the write operation of the memory system 100 is substantially completed, utilization of the host buffer 230 may be increased. Also, at the same time, the write error that occurs in the memory system 100 may still be recovered through the host 200.

Figure 3:
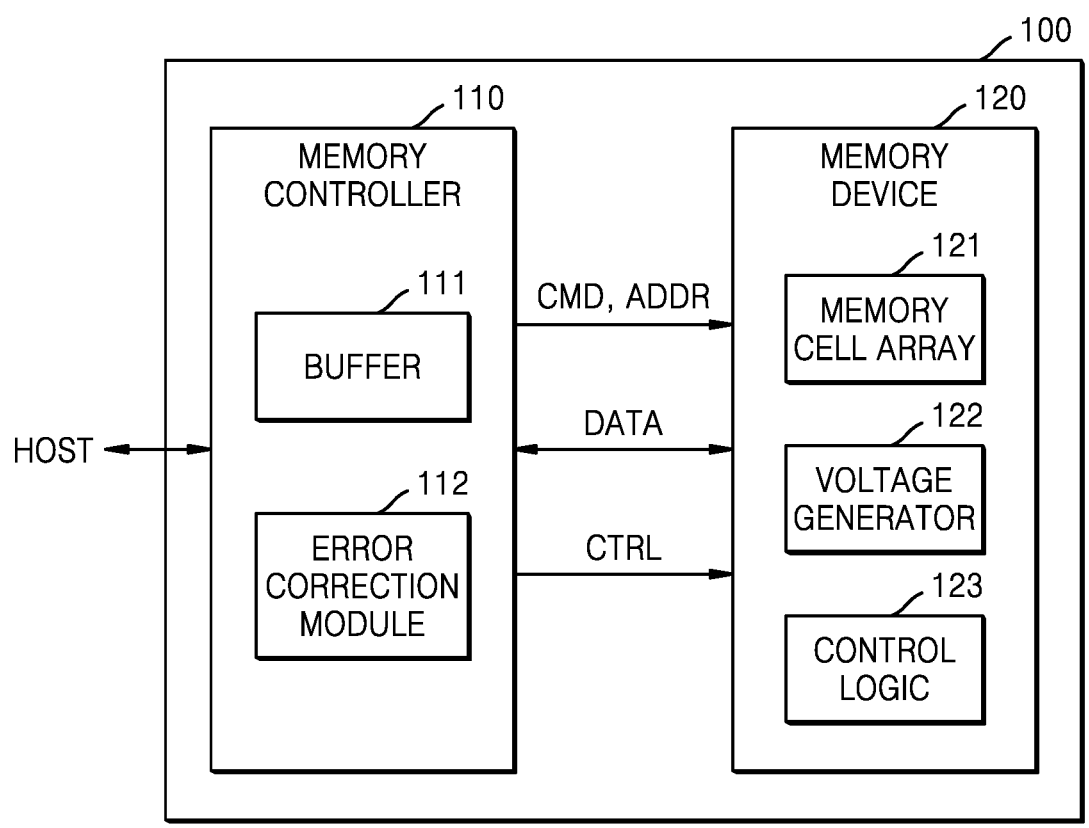
FIG. 3 is a block diagram of a memory system according to an embodiment.

FIG. 3 is a block diagram of a memory system according to an embodiment.

Referring to FIG. 3, the memory system 100 may include the memory controller 110 and the memory device 120, the memory controller 110 may include the buffer 111 and an error correction module 112, and the memory device 120 may include a memory cell array 121, a voltage generator 122, and a control logic 123.

The memory controller 110 may control the memory device 120 to write data to the memory device 120 or read or erase data stored in the memory device 120 in response to a write/read request of a host HOST. In detail, the memory controller 110 may control a write, read, or erase operation with respect to the memory device 120 by providing the memory device 120 with an address ADDR, a command CMD, or a control signal CTRL. Also, data DATA to be written to the memory device 120 and data DATA read from the memory device 120 may be transmitted and received between the memory controller 110 and the memory device 120.

In addition, according to an embodiment, the memory controller 110 may store received write data and physical address in the buffer 111 in response to the write request of the host HOST. Moreover, the memory controller 110 may perform the write operation on the memory device 120 on the basis of the write data and the physical address stored in the buffer 111. Furthermore, when the write operation is completed, the memory controller 110 may delete the write data and the physical address stored in the buffer 111. When the write operation fails, the memory controller 110 may retain the write data and the physical address stored in the buffer 111 without deleting them. Before performing the write operation, the memory controller 110 may generate information used for a recovery in preparation for an error that may subsequently occur, by using the error correction module 112. The error correction module 112 may perform ECC encoding on the basis of the write data received from the host HOST. For example, the error correction module 112 may perform an exclusive OR (XOR) operation on write data to generate an ECC parity and transmit the write data and the generated ECC parity to the memory device 120.

Also, the error correction module 112 may detect error bits in data received from the memory device 120 and perform an ECC operation of correcting the detected error bits. The error correction module 112 may determine whether the number of error bits detected in the received data exceeds an error correction capability of the error correction module 112. When the number of detected error bits exceeds the error correction capability, the error correction module 112 may determine that a read error occurs.

In an embodiment, the error correction module 112 may generate a recovery parity of pieces of write data in a recovery unit according to a RAID scheme. Also, the error correction module 112 may generate an ECC parity for the generated recovery parity. In addition, the error correction module 112 may transmit the generated recovery parity or the ECC parity of the recovery parity to the memory device 120. An example of this will be described in detail later with reference to FIG. 6.

The error correction module 112 is described above as generating the ECC parity or generating the recovery parity according to the RAID scheme. However, the error correction module 112 may include an ECC module that generates the ECC parity and/or a RAID module that generates the recovery parity according to the RAID scheme.

The memory device 120 may be a nonvolatile memory device. The memory cell array 121 may include a plurality of memory cells, for example, the plurality of memory cells may be flash memory cells. However, embodiments are not limited thereto, and the plurality of memory cells included in the memory cell array 121 may be resistive memory cells such as resistive random access memories (ReRAMs), phase change RAMs (PRAMs), or magnetic RAMs (MRAMs).

The memory cell array 121 may include a plurality of blocks. Also, each of the plurality of blocks may include a plurality of pages, and each of the plurality of pages may include a plurality of memory cells. In the memory cell array 121, an erase operation of data may be performed in units of blocks, and write and read operations of data may be performed in units of pages. For example, the memory device 120 may perform an erase operation in units of blocks and perform write and read operations in units of pages with reference to the address ADDR provided by the memory controller 110.

The voltage generator 122 may generate various types of voltages for performing the write/read/erase operations described above. For example, the write operation of data may be performed by using an Incremental Step Pulse Program (ISPP), and the voltage generator 122 may generate a plurality of voltages used for the ISPP and provide the memory cell array 121 with the plurality of voltages. Also, the voltage generator 122 may generate a read voltage used for the read operation of data and provide the memory cell array 121 with the read voltage. In addition, the voltage generator 122 may generate an erase voltage having a high voltage level used for the erase operation and provide the memory cell array 121 with the erase voltage.

The control logic 123 may control an overall operation of the memory device 120 in association with a memory operation. For example, the control logic 123 may control the voltage generator 122, and the voltage generator 122 may change levels of various types of generated voltages under control of the control logic 123. Also, a threshold voltage distribution of the memory cells of the memory cell array 121 may be adjusted according to the voltages generated by the voltage generator 122.

Figure 4:
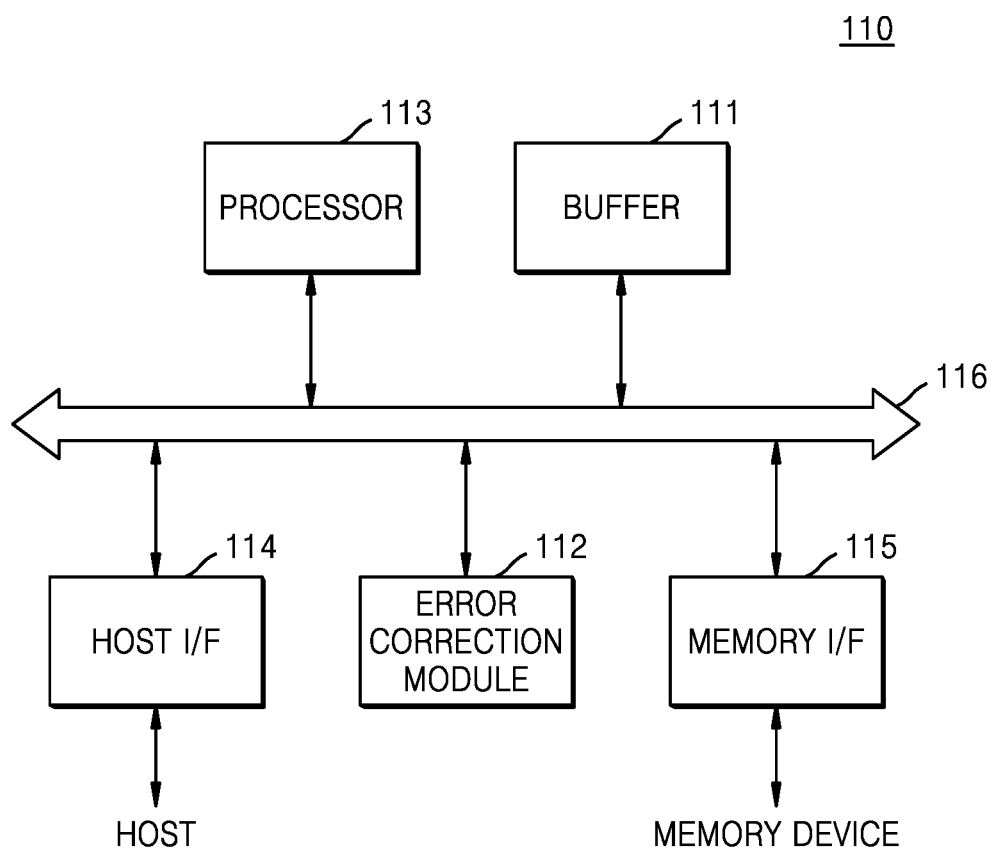
FIG. 4 is a view illustrating a memory controller according to an embodiment.

FIG. 4 is a view illustrating an example of a memory controller according to an embodiment.

Referring to FIGS. 3 and 4, the memory controller 110 may include the buffer 111, the error correction module 112, a processor 113, a host interface 114, and a memory interface 115 that may communicate with one another through a bus 116. The buffer 111 and the error correction module 112 may be substantially the same as described above with reference to FIG. 3, and thus, redundant descriptions thereof will be omitted.

The buffer 111 may operate under control of the processor 113 and may be multiple. The buffer 111 may be a volatile memory such as dynamic RAM (DRAM) or static RAM (SRAM), or may a nonvolatile memory such as PRAM or a flash memory. According to an embodiment, the buffer 111 may temporarily store write data and a physical address received from the host HOST. The buffer 111 is illustrated and described in FIG. 4 as being included in the memory controller 110, but the buffer 111 may be a separate element from the memory controller 110.

Also, the memory system 100 according to an embodiment may further include a memory. The memory may be a volatile memory or a nonvolatile memory like the buffer 111 and may be used as an operating memory, a buffer memory, a cache memory, or the like.

The error correction module 112 may be HW. In an embodiment, when a HW accelerator is included in the memory controller 110, the HW accelerator may include the error correction module 112 as an accelerator dedicated for an XOR operation. The HW accelerator may be various types of accelerators such as a field-programmable gate array (FPGA), a massively parallel processor array (MPPA), a graphics processing unit (GPU), an application-specific integrated circuit (ASIC), a neural processing unit (NPU), a tensor processing unit (TPU), a multi-processor system on-chip (MPSoC), and the like. However, embodiments are not limited thereto, and the error correction module 112 may be firmware or SW and may be loaded into the buffer 111 or the memory.

The processor 113 may include a central processing unit, a microprocessor, or the like and may control an overall operation of the memory controller 110 by executing instructions stored in the buffer 111 or the memory.

The host interface 114 may provide a physical connection between the host HOST and the memory system 100. For example, the host interface 114 may include various interface methods such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), a secure digital (SD) card, a multi-media card (MMC), an embedded multi-media card (eMMC), a compact flash (CF) card interface, non-volatile memory express (NVMe), and the like.

Also, the host interface 114 may transmit various types of information to the host 200 in an asynchronous mode under control of the processor 113. For example, the host interface 114 may transmit various types of information to the host 200 by generating an interrupt in a preset area of the host 200, which may be embodied in various ways such as MSI, MSI-X, pin based, Advanced Error Reporting (AER), and the like.

According to an embodiment, the host interface 114 may receive a write request from the host 200 and transmit a response signal corresponding to the write request to the host 200. Also, the host interface 114 may transmit error occurrence information to the host 200 in an asynchronous mode. For example, the host interface 114 may transmit AEI notifying an occurrence of a write error to the host 200. Also, the host interface 114 may receive a request signal requesting information about an error from the host 200 and transmit write data having a write error and information used for a recovery to the host 200. In addition, the host interface 114 may receive a write request for a recovery from the write error from the host 200.

The memory interface 115 may provide a channel between the memory controller 110 and the memory device 120. For example, the command CMD, the address ADDR, the data DATA, and the like may be transmitted and received between the memory controller 110 and the memory device 120 through the memory interface 115.

Figure 5:
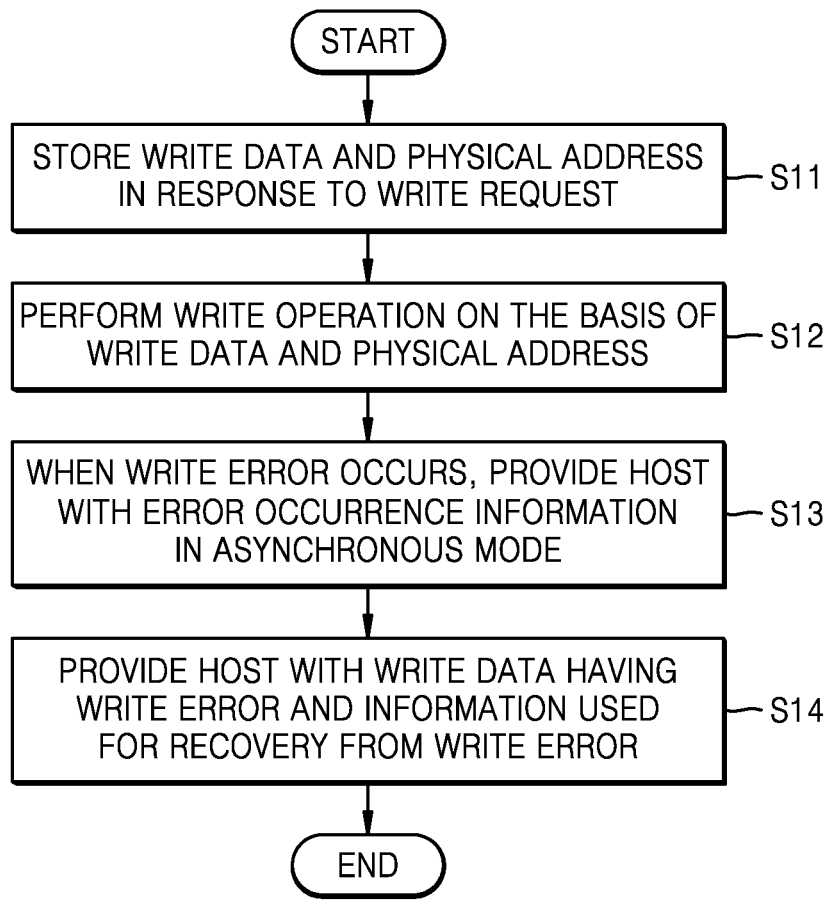
FIG. 5 is a flowchart of an operating method of a memory system, according to an embodiment.

FIG. 5 is a flowchart of an example of an operating method of a memory system, according to an embodiment.

In embodiments, the term "write data" may correspond to "user data", or to "metadata" or to any other type of data. Also, the operating method according to this embodiment may be performed in the memory system 100 of FIG. 1 or 2. The above description with reference to FIGS. 1 through 4 may also be applied to the present embodiment.

In operation S11, a memory system may store write data and a physical address received from a host in a buffer in response to a write request of the host. For example, when receiving a write command from the host, the memory system may store the received write data and physical address in an area of the buffer allocated for a write operation. Also, the memory system may transmit a response signal to the host.

In operation S12, the memory system may perform a write operation on the basis of the write data and the physical address. For example, the memory system may write the write data to an area of a memory device corresponding to the physical address stored in the buffer.

Before performing the write operation, the memory system may generate information used for a recovery. For example, the memory system may generate an ECC parity through an XOR operation on the basis of the received write data or may generate a recovery parity of pieces of write data in a recovery unit according to a RAID scheme. The information used for the recovery is not limited to the example described above, and various types of information may be generated. Also, the memory system may write the write data and generated parity information. In addition, the memory system may update metadata such as mapping information, attribute information, or the like.

In operation S13, when a write error occurs, the memory system may provide the host with error occurrence information in an asynchronous mode. For example, when the write error occurs, the memory system may transmit AEI, and the AEI may include a physical address of write data having the write error.

In operation S14, the memory system may provide the host with the write data having the write error and the information used for the recovery. For example, the memory system may first read information used for a recovery from a write error from the memory device to temporarily store the information in the buffer, and when receiving a request signal from the host, may provide the host with the write data having the write error and the information used for the recovery, stored in the buffer.

In an embodiment, when receiving the request signal from the host, the memory system may read the write data having the write error and the information used for the recovery to provide the host with the write data having the write error and the information used for the recovery. Here, when a physical address of the information used for the recovery is included in the request signal received from the host, the memory system may read the information used for the recovery on the basis of the included physical address. In an embodiment, even if the physical address is not received from the host, the memory system may check and read the physical address of the information used for the recovery with reference to directory information or the like.

Here, the information used for the recovery may include the ECC parity of the write data having the write error and/or the recovery parity and may further include normal data within the recovery unit in which the write error occurs. Also, the information used for the recovery may also include metadata.

In addition, when a further write request is provided by the host, the memory system may perform a write operation in response to the further write request. Here, the further write request provided by the host may be a request for recovering data with a write error and rewriting the recovered data to the memory system.

Figure 6:
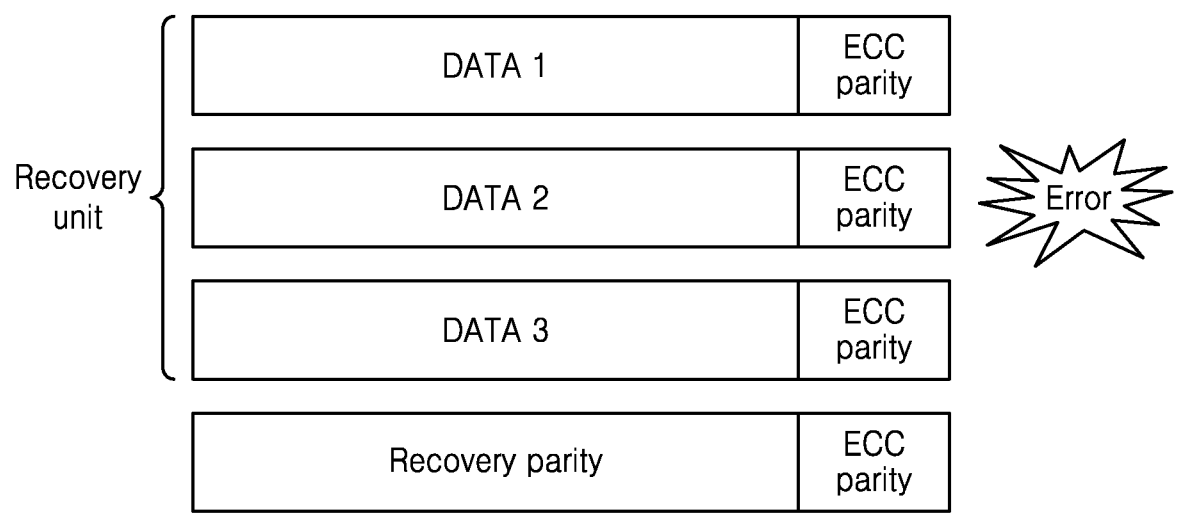
FIG. 6 is a view illustrating an example of information used for a recovery from a write error according to an embodiment.

FIG. 6 is a view illustrating an example of information used for a recovery according to an embodiment.

Referring to FIGS. 1 through 6, the memory system 100 may receive a plurality of pieces of write data and a plurality of physical addresses from the host 200. Also, the memory system 100 may write the plurality of pieces of received write data and the plurality of received physical addresses to a memory device. Before performing a write operation, the memory system 100, or for example the error correction module 112 of FIG. 3, may generate information used for a recovery in preparation for an error that may subsequently occur. The operation of generating the information used for the recovery may be performed by various methods.

For example, the memory system 100 may perform an XOR operation on write data to generate an ECC parity. Referring to FIG. 6, the memory system 100 may perform an XOR operation on each of a plurality of pieces of write data DATA1 through DATA3 to generate respective ECC parities. Also, the memory system 100 may write an ECC parity generated as information used for a recovery to the memory device in conjunction with write data.

In addition, the memory system 100 may generate a recovery parity of pieces of write data in a recovery unit according to a RAID scheme. Referring to FIG. 6, an XOR operation may be performed on the pieces of write data DATA1 through DATA3 in a recovery unit to generate a recovery parity. When the memory system 100 generates both the ECC parity and the recovery parity according to the RAID scheme, an ECC parity for the recovery parity may also be further generated.

Also, the memory system 100 may write the recovery parity generated as the information used for the recovery to the memory device 120. Here, an area in which the recovery parity is stored may be different from an area in which pieces of write data are stored. In addition, when pieces of write data in a plurality of recovery units exist, areas in which respective recovery parities of the plurality of recovery units are stored may also be the same as or different from one another, and this may be determined according to a level of an applied RAID. For example, in the case of RAID 4, recovery parities of respective recovery units may be stored in the same block in the memory device, and in the case of RAID 5, recovery parities of respective recovery units may be stored in different blocks in the memory device.

As shown in FIG. 6, a write error may occur in the write data DATA2. Because the write data DATA2 is not written to the memory device 120 due to the write error, the memory system 100 may read the write data DATA2 with the write error from the buffer 111 and read information used for recovering the write data DATA2 from the memory device 120. Also, the memory system 100 may provide a host with the write data DATA2 with the write error and the information used for the recovery. The information used for recovering the write data DATA2 may include an ECC parity of the write data DATA2. Also, when the recovering is performed according to a RAID scheme, the information used for the recovery may further include a recovery parity of the write data DATA2, and normal data, for example write data DATA1 and DATA3, among the pieces of write data in the recovery unit to which the write data DATA2 belongs, for example DATA1 through DATA3. In addition, the information used for recovering the write data DATA2 may include mapping information of metadata, and when the write data DATA2 with the write error belongs to a user data area, may further include attribute information of the metadata indicating whether the write data DATA2 is valid.

The host 200 may perform a recovery of the write data DATA2 on the basis of the write data DATA2 and the information used for recovering the write data DATA2, acquired from the memory system 100. For example, the host 200 may correct a bit with an error on the basis of the write data DATA2 with the write error and the ECC parity. Also, the host 200 may recover data with a write error on the basis of a recovery parity and pieces of normal data in a recovery unit. In addition, the host 200 may perform recovery further considering the metadata, and the method, performed by the host 200, of performing recovery is not limited to the example described above.

The memory system 100 is illustrated and described with respect to FIG. 6 as providing the host 200 with the write data DATA2 with the write error. However, the memory system 100 may also not provide the host 200 with the write data DATA2 with the write error, but instead provide the host with only the information used for the recovery. For example, when the memory system 100 generates only a recovery parity according to a RAID scheme, the host 200 may recover write data on the basis of only the write data DATA1 and DATA3, which are normal data, in the recovery unit corresponding to the recovery parity and the write data having a write error.

Figure 7:
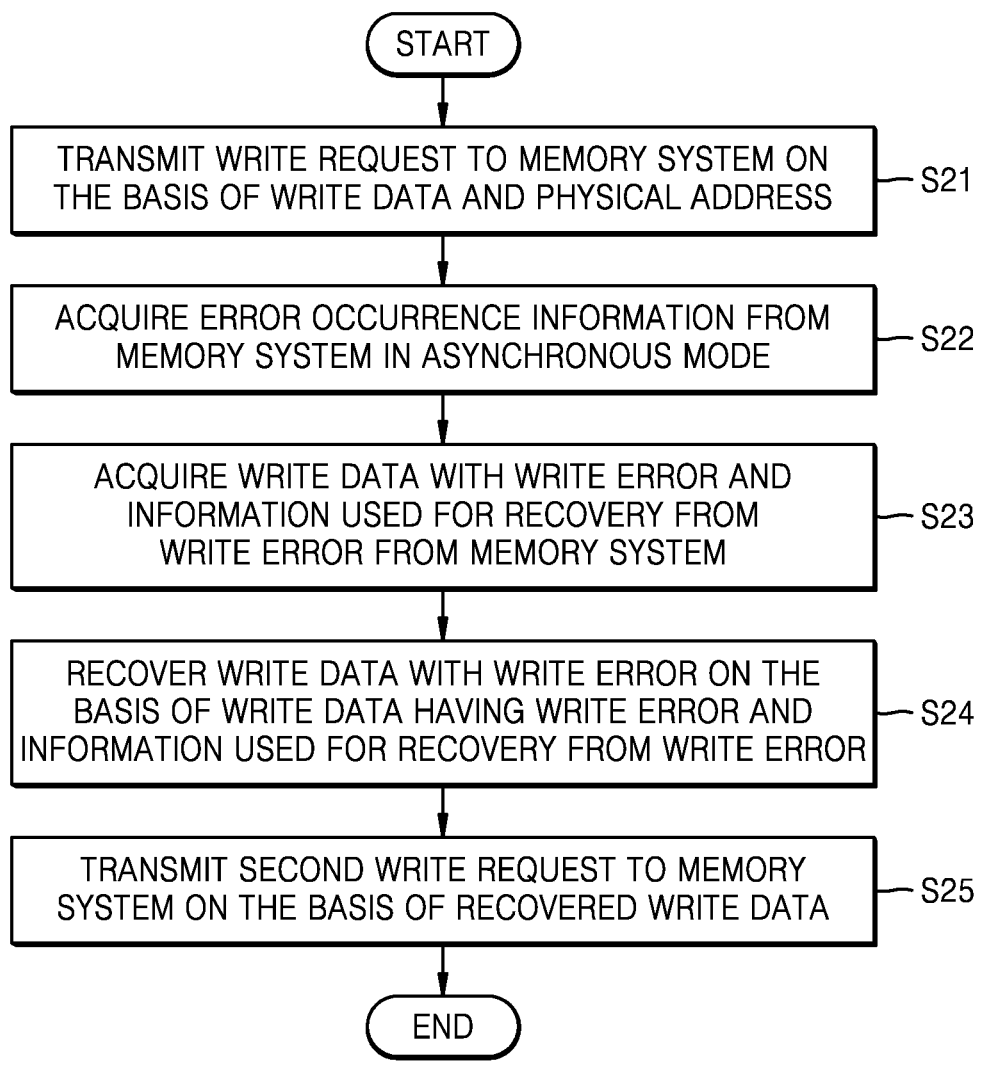
FIG. 7 is a flowchart of a recovering method of a host according to an embodiment.

FIG. 7 is a flowchart of an example of a recovering method of a host according to an embodiment.

An operating method according to this embodiment may be performed in the host 200 of FIG. 1 or 2. Hereinafter, operations illustrated in FIG. 7 will be described as being performed by a host, and in more detail, at least some of the operations illustrated in FIG. 7 may correspond to operations performed in a recovery module in the host.

In operation S21, the host may transmit a write request to a memory system on the basis of write data and a physical address. For example, the host may provide the write request on the basis of the physical address and the write data, by using mapping information of the memory system. Also, when receiving a response signal to the provided write request from the memory system, the host may deallocate write data and address information corresponding to the write request from a buffer in the host. Therefore, the host may increase utilization of the buffer.

In operation S22, the host may acquire error occurrence information from the memory system in an asynchronous mode. For example, the host may acquire AEI from the memory system, and the AEI may include a physical address of write data having a write error.

In operation S23, the host may acquire write data having a write error and information used for a recovery from the write error from the memory system. For example, when acquiring the AEI, the host may transmit a signal requesting information associated with an error to the memory system in response thereto. Also, the host may acquire the write data having the write error and the information used for the recovery from the memory system.

In an embodiment, the host may check an operation state of the host when acquiring AEI and transmit a request signal when entering an idle state Idle, or transmit a request signal requesting information associated with a plurality of errors when acquiring the preset number of pieces of AEI to acquire the information.

In an embodiment, the host may check a physical address of information used for a recovery on the basis of a physical address of write data having a write error, included in AEI and directory information of the memory system, and transmit a request signal with the checked physical address to the memory system to acquire information. The method, performed by the host, of acquiring the write data having the write error and the information used for the recovery is not limited to the example described above.

In operation S24, the host may recover write data having an error on the basis of the write data having the write error and the information used for the recovery. Here, the information used for the recovery may include at least of an ECC parity of the write data having the write error, a recovery parity, normal data in a recovery unit in which the write error occurs, and metadata. Also, the metadata may include mapping information and, when the write data having the write error belongs to a user data area, may further include attribute information indicating whether the corresponding write data is valid.

In operation S25, the host may transmit a second write request to the memory system on the basis of the recovered write data. For example, the host may determine a new physical address by using mapping information of the memory system, generate the second write request on the basis of the new physical address and the recovered write data, and provide the memory system with the second write request. In addition, when receiving a response signal to the second write request from the memory system, the host may update the mapping information of the memory system.

Figure 8:
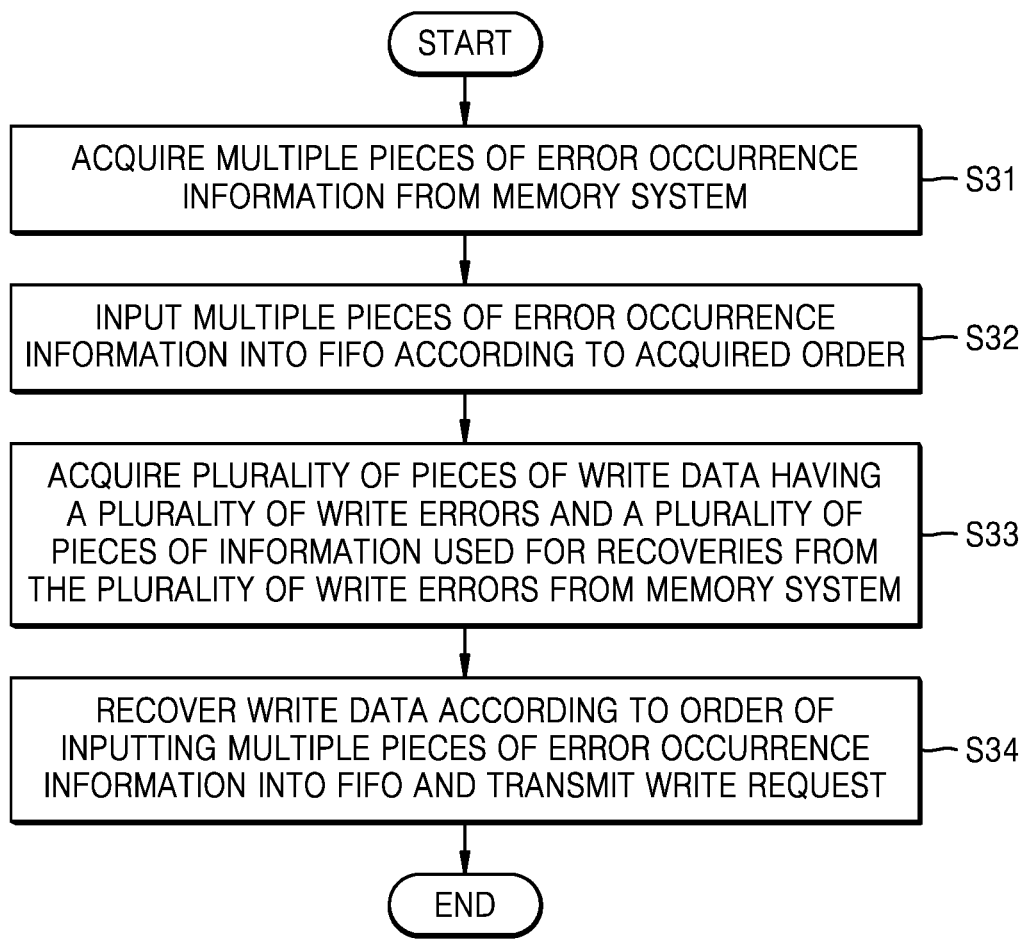
FIG. 8 is a flowchart of a recovering method of a host when a plurality of write errors occur, according to an embodiment.

FIG. 8 is a flowchart of an example of a recovering method of a host when a plurality of write errors occur, according to an embodiment.

FIG. 8 is a flowchart of an example of a recovering method of a host according to an embodiment. When the host provides a plurality of write requests, and a memory system performs a plurality of write operations, a plurality of write errors may occur. Hereinafter, a recovering method of the host when a plurality of write errors occur, will be described. In describing operations illustrated in FIG. 8, detailed descriptions of the same operations as in FIG. 7 will be omitted.

In operation S31, the host may acquire a plurality of pieces of error occurrence information from the memory system. For example, the host may acquire a plurality of pieces of AEI. In operation S32, the host may input the plurality of pieces of error occurrence information into First In First Out (FIFO) according to the acquired order. For example, the host may input the plurality of pieces of acquired AEI into the FIFO in the host according to the acquired order. In an embodiment, the host may input physical addresses included in the plurality of pieces of AEI into the FIFO in the host according to the acquired order. In operation S33, the host may acquire, from the memory system, pieces of write data having a plurality of write errors, and pieces of information used for recoveries from the plurality of write errors.

In operation S34, the host may respectively recover the pieces of write data having the write errors and provide the memory system with a new write request according to the input order of the plurality of pieces of error occurrence information in the FIFO. For example, the host may perform recovery by using AEI first input into the FIFO or write data corresponding to a physical address and information used for a recovery. Also, the host may generate a new write request on the basis of recovered write data and a new physical address and provide the memory system with the new write request. In addition, the host may iterate the above operation with respect to a write error input into the FIFO in a next order.

Figure 9:
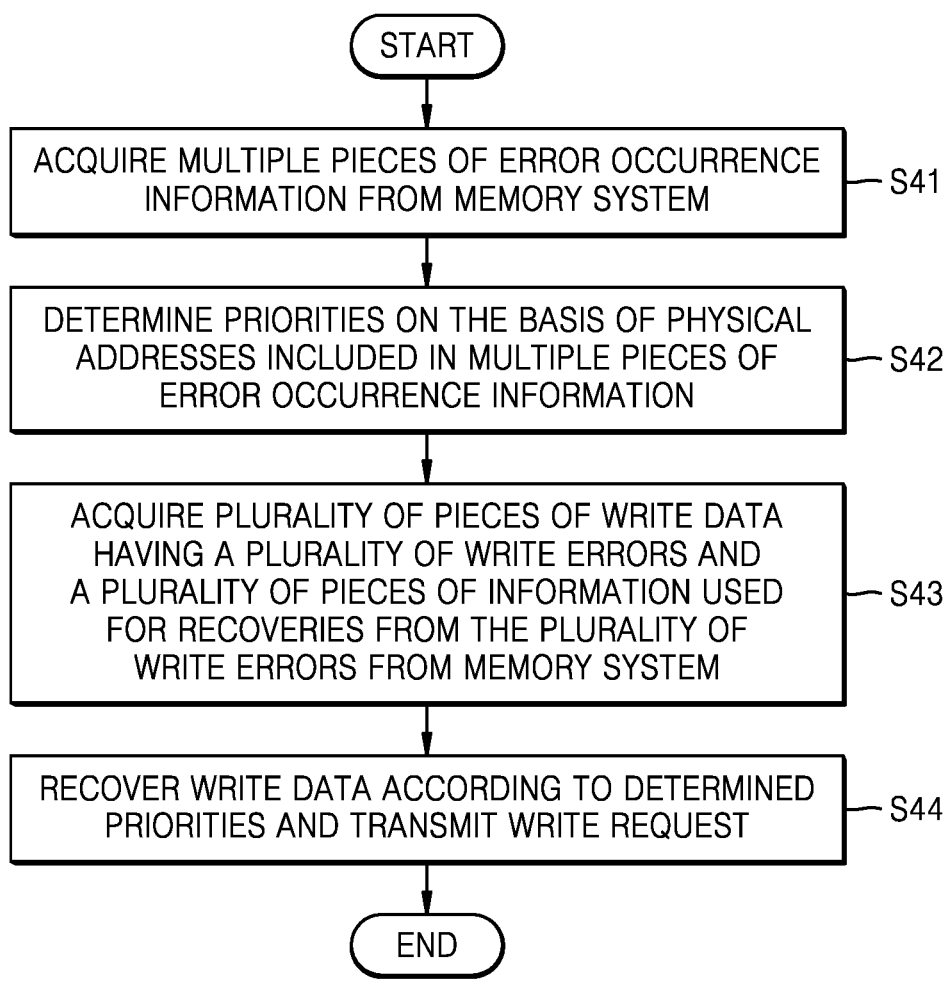
FIG. 9 is a flowchart of a recovering method of a host when a plurality of write errors occur, according to another embodiment.

FIG. 9 is a flowchart of an example of a recovering method of a host when a plurality of write errors occur, according to an embodiment.

FIG. 9 is a flowchart of an example of a recovering method of a host according to an embodiment. Hereinafter, another recovering method of a host when a plurality of write errors occur will be described. In describing operations illustrated in FIG. 9, detailed descriptions of the same operations as in FIGS. 7 and 8 will be omitted.

In operation S41, the host may acquire a plurality of pieces of error occurrence information from a memory system. For example, the host may acquire a plurality of pieces of AEI.

In operation S42, the host may determine priorities on the basis of physical addresses included in the plurality of pieces of error occurrence information. For example, the host may determine in which area of a storage area of the memory system each of a plurality of errors occurs, on the basis of the physical addresses included in the plurality of pieces of AEI. For example, the host may check whether the plurality of errors occur in a user data area or a metadata area of the memory system. Also, the host may determine a priority on the basis of an area in which an error occurs. For example, the host may determine to first recover from an error that occurs in the metadata area. The method, performed by the host, of determining the priorities on the basis of the physical addresses is not limited thereto.

In operation S43, the host may acquire, from the memory system, a plurality of pieces of write data respectively with a plurality of write errors, and pieces of information respectively used for recovering from the plurality of write errors. In operation S44, the host may respectively recover the pieces of write data having the write errors according to the determined priorities and provide the memory system with a new write request. For example, the host may perform recovery by using write data corresponding to the error occurring in the metadata area among the plurality of errors and information used for a recovery. Also, the host may generate a new write request on the basis of the recovered write data and a new physical address and provide the memory system with the new write request. In addition, the host may iterate the above operation with respect to an error that occurs in the user data area.

The host is illustrated and described with respect to FIGS. 8 and 9 as determining the priorities on the basis of the order of acquiring the plurality of pieces of error occurrence information or the physical addresses included in the plurality of pieces of error occurrence information. However, the host may also determine priorities on the basis of information used for a recovery.

Figure 10:
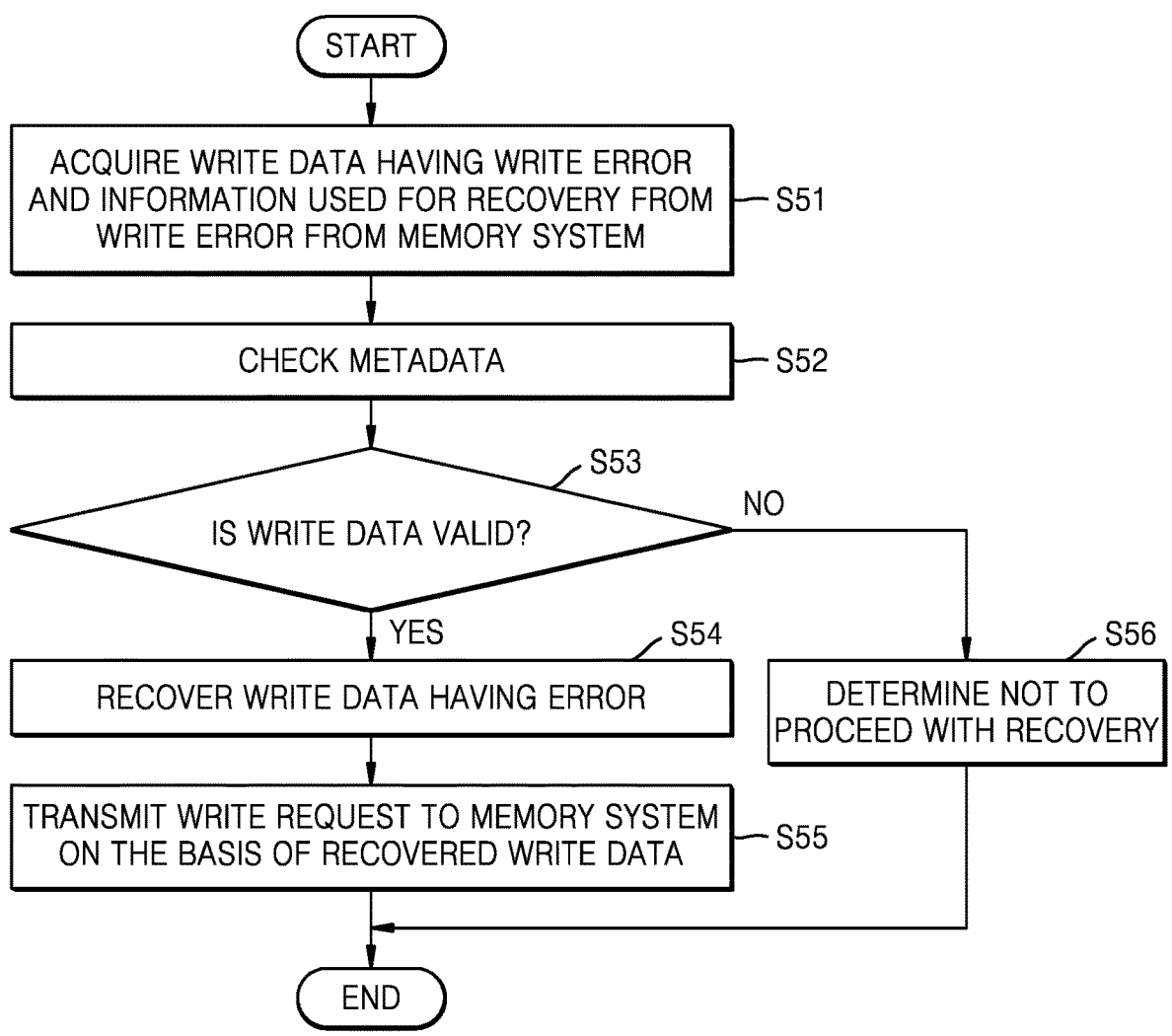
FIG. 10 is a flowchart of a recovering operation of a host using metadata according to an embodiment.

FIG. 10 is a flowchart illustrating an example of a recovering operation of a host using metadata according to an embodiment.

FIG. 10 is a flowchart of an example of a recovering method of a host according to an embodiment. In an embodiment, some write data having a write error may not need to be recovered. Hereinafter, a method, performed by the host, of determining whether write data having a write error needs to be recovered will be described. For example, in describing operations illustrated in FIG. 10, detailed descriptions of the same operations as in FIG. 7 will be omitted.

In operation S51, the host may acquire write data having a write error and information used for a recovery from the write error from a memory system. In operation S52, the host may check metadata among the information used for the recovery. For example, the host may check attribute information indicating whether write data having a write error is valid, among various types of acquired information used for a recovery.

In operation S53, the host may check whether the write data is valid, on the basis of the metadata. When the write data is valid, the host may recover the write data having the write error in operation S54. In operation S55, the host may transmit a write request to the memory system on the basis of the recovered write data. When the write data is invalid, the host may determine not to proceed with the recovery of the write data having the write error in operation S56.

According to the embodiment described above, although the write error occurs, the host may be prevented from recovering write data that is not valid for any reason, thereby reducing unnecessary operations of the host.

The host is illustrated and described with respect to FIG. 10 as acquiring all of information used for a recovery from a write error and check metadata. However, the host may first acquire only metadata for write data having a write error from a memory system to check whether the write data is valid. For example, the host may first check metadata for write data having a write error. If the validity of the write data is confirmed, the host may acquire an ECC parity of the write data having the write error and/or a recovery parity from the memory system to perform recovery. However, If the validity of the write data is not confirmed, the host may not acquire further information from the memory system and may not perform a recovering operation.

Figure 11:
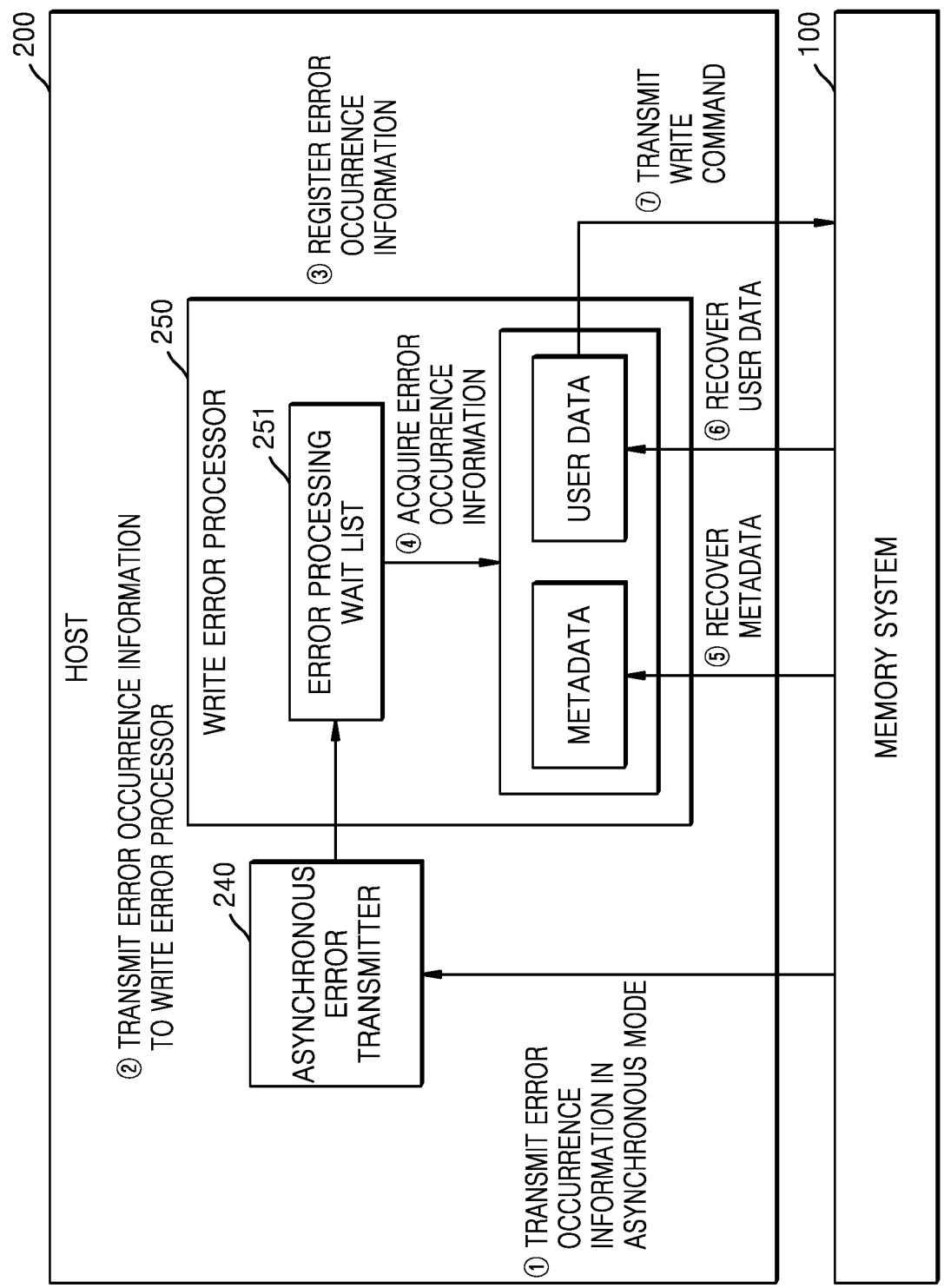
FIG. 11 is a conceptual diagram illustrating respective operations of a host and a memory system associated with a recovery from a write error in a computing system, according to an exemplary embodiment.

FIG. 11 is a conceptual diagram illustrating examples of respective operations of a host and a memory system associated with a recovery from a write error in a computing system according to an exemplary embodiment.

An operating method according to this embodiment may be performed in the computing system 1000 of FIG. 1 or 2. The above description with FIGS. 1 through 10 may also be applied to this embodiment. The host 200 may include an asynchronous error transmitter 240 and a write error processor 250, and the asynchronous error transmitter 240 and/or the write error processor 250 may form part of a recovery module of the host 200. The asynchronous error transmitter 240 and the write error processor 250 may be HW, may be SW, or may be a combination of HW and SW.

The memory system 100 may transmit error occurrence information to the asynchronous error transmitter 240 of the host 200 in an asynchronous mode at operation ①. For example, when a write error occurs, the memory system 100 may transmit error occurrence information, or for example AEI, to the asynchronous error transmitter 240 of the host 200. Here, the error occurrence information may include an error type indicating that a generated error corresponds to a write error and a physical address of data with an error.

Also, the asynchronous error transmitter 240 may determine a type of an error that occurs in the memory system 100, on the basis of the error occurrence information. In addition, when the error that occurs in the memory system 100 is a write error, the asynchronous error transmitter 240 may transmit the error occurrence information to the write error processor 250 that performs a recovery from the write error at operation ②. According to an embodiment, when the host 200 includes a separate processor such as a read error processor, the asynchronous error transmitter 240 may transmit error occurrence information to a processor corresponding to an error type.

In addition, the write error processor 250 may register the error occurrence information received from the asynchronous error transmitter 240 in an error processing wait list 251 at operation ③. When a plurality of pieces of error occurrence information are transmitted, the write error processor 250 may register the plurality of pieces of error occurrence information in the error processing wait list 251 according to the transmitted order or may determine priorities on the basis of physical addresses of the plurality of pieces of error occurrence information to register the plurality of pieces of error occurrence information in the error processing wait list 251.

Also, the write error processor 250 may acquire error occurrence information from the error processing wait list 251 at operation ④. For example, when receiving a signal indicating that information used for a recovery is ready, from the memory system 100, the write error processor 250 may acquire error occurrence information from the error processing wait list 251. In an embodiment, the write error processor 250 may acquire error occurrence information from the error processing wait list 251 at a point in time when recovery is performed, for example at a point in time when the host 200 enters an idle state.

The write error processor 250 may acquire metadata and information used for a recovery thereof from the memory system 100 to perform recovery at operation ⑤. For example, when data with a write error is metadata, the write error processor 250 may acquire the metadata with the write error, an ECC parity thereof, and/or a recovery parity from the memory system 100 to recover the metadata. Also, even when the data with the write error is user data, the write error processor 250 may acquire metadata, an ECC parity thereof, and/or a recovery parity. In addition, the write error processor 250 may recover the user data by using acquired information.

The write error processor 250 may acquire user data and information used for a recovery thereof from the memory system 100 to perform recovery at operation ⑥. For example, the write error processor 250 may acquire user data with a write error, an ECC parity thereof, and/or a recovery parity from the memory system 100 to recover the user data. Here, the write error processor 250 may recover the user data by using metadata or the like that is previously acquired. For example, the write error processor 250 may check validity information of the user data included in the metadata and, when the user data is valid, perform recovery. In embodiments, the recovering operations ⑤ and ⑥ of the write error processor 250 for the metadata and the user data may be sequentially performed as in the above description or may simultaneously performed.

Also, the write error processor 250 may determine a new physical address by using mapping information of the memory system 100, generate a write request on the basis of the new physical address and recovered write data, and provide the memory system 100 with the write request at operation ⑦.

The host 200 is illustrated and described with respect to FIG. 11 as including the error processing wait list 251. However, when the host 200 is capable of simultaneously processing recoveries from a plurality of write errors, the host 200 may perform recovery without including the error processing wait list 251.

Figure 12:
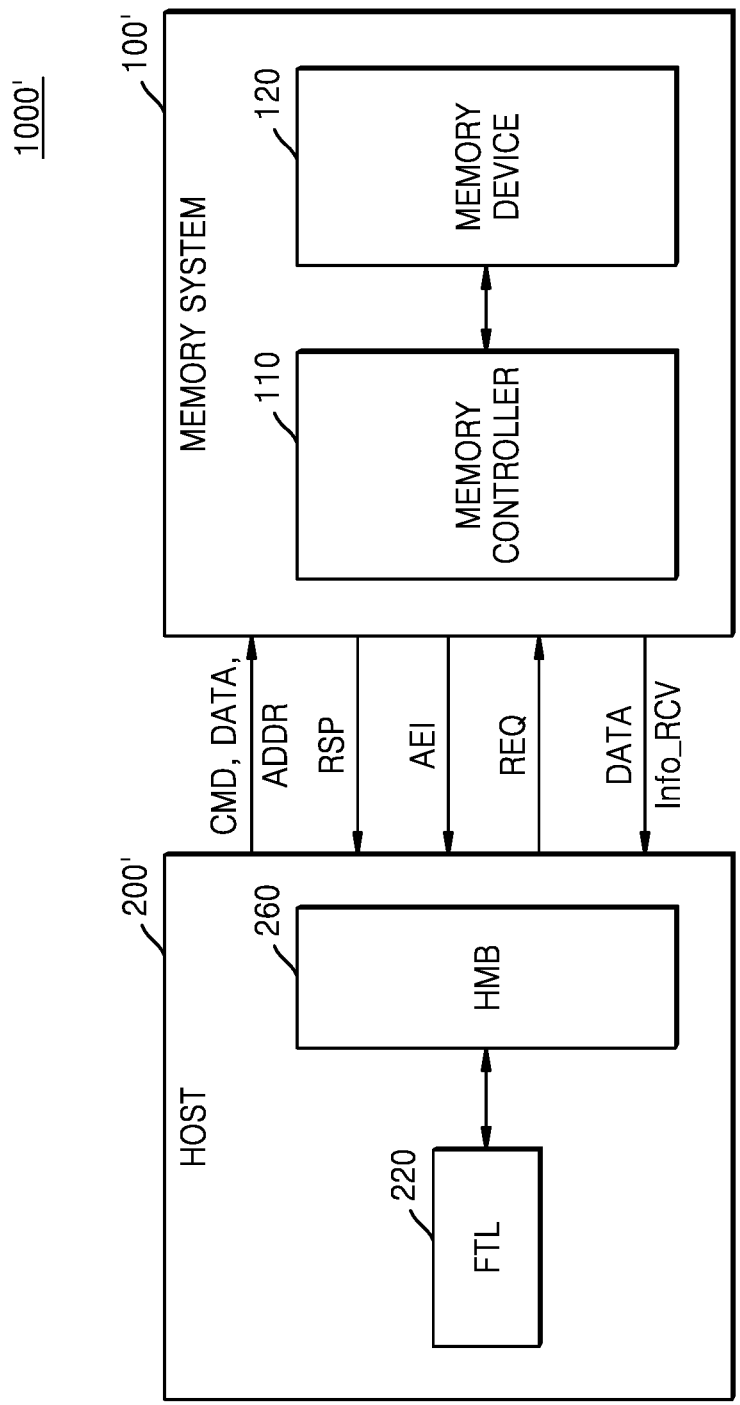
FIG. 12 is a block diagram of a computing system including a Host Memory Buffer (HMB) according to an embodiment.

FIG. 12 is a block diagram of a computing system including a Host Memory Buffer (HMB) according to an embodiment.

FIG. 12 illustrates a computing system according to an embodiment. Referring to FIG. 12, a computing system 1000' may include a memory system 100' and a host 200'. Also, the memory system 100' may include the memory controller 110 and the memory device 120, and the host 200' may include the FTL 220 and an HMB 260.

The HMB 260 may be a buffer memory existing in the host 200' and may be a memory to which an access to the memory system 100' is allocated. The memory system 100' may directly access and use the HMB 260. The memory system 100' may directly store various types of information, associated with a write error that occurs in the memory system 100', in the HMB 260. For example, when a write error occurs, the memory system 100' may generate AEI, store the AEI in the HMB 260, read write data and information used for a recovery, and store the write data and the information in the HMB 260.

Also, the host 200' may access the HMB 260 to acquire the AEI, the write data, and the information used for the recovery. For example, the host 200' may access the HMB 260 at preset time intervals to check whether AEI exists and, when checking that a write error occurs in the memory system 100', acquire remaining write data and information used for a recovery from the HMB 260 to perform a recovering operation. In an embodiment, when the memory system 100' stores various types of information associated with a write error in the HMB 260 and then transmits a return signal indicating that storing is completed to the host 200', the host 200' may directly access the HMB 260 to acquire the various types of information associated with the write error and perform a recovering operation.

Figure 13:
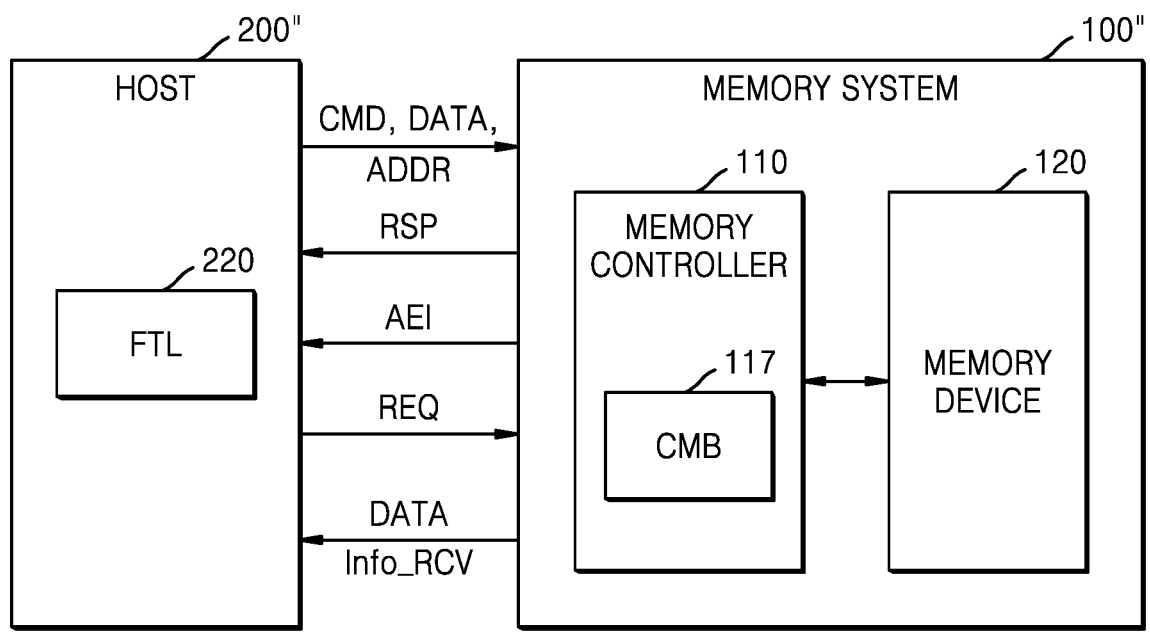
FIG. 13 is a block diagram of a computing system including a Controller Memory Buffer (CMB) according to an embodiment.

FIG. 13 is a block diagram of a computing system including a Controller Memory Buffer (CMB) according to an embodiment.

FIG. 13 illustrates a computing system according to a modifiable embodiment. Referring to FIG. 13, a computing system 1000" may include a memory system 100" and a host 200". Also, the memory system 100" may include the memory controller 110 and the memory device 120, and the host 200" may include the FTL 220. In addition, the memory controller 110 may include a CMB 117.

The CMB 117 may be a buffer memory existing in the memory controller 110 and is a memory to which an access to the host 200" is allocated. The host 200" may directly access and use the CMB 117. The memory system 100" may store various types of information, associated with a write error that occurs in the memory system 100", in the CMB 117. For example, when a write error occurs, the memory system 100" may generate AEI to store the AEI in the CMB 117 and read write data and information used for a recovery to store the write data and the information in the CMB 117.

Also, the host 200" may access the CMB 117 to acquire the AEI, the write data, and the information used for the recovery. For example, the host 200" may access the CMB 117 at preset time intervals to check whether AEI exists and, when checking that a write error occurs in the memory system 100", acquire remaining write data and information used for a recovery from the CMB 117 to perform a recovering operation. In an embodiment, when the memory system 100" may store various types of information associated with a write error in the CMB 117 and then transmits a return signal indicating that the storing is completed to the host 200", the host 200" may directly access the CMB 117 to acquire the various types of information associated with the write error and perform a recovering operation.

Figure 14:
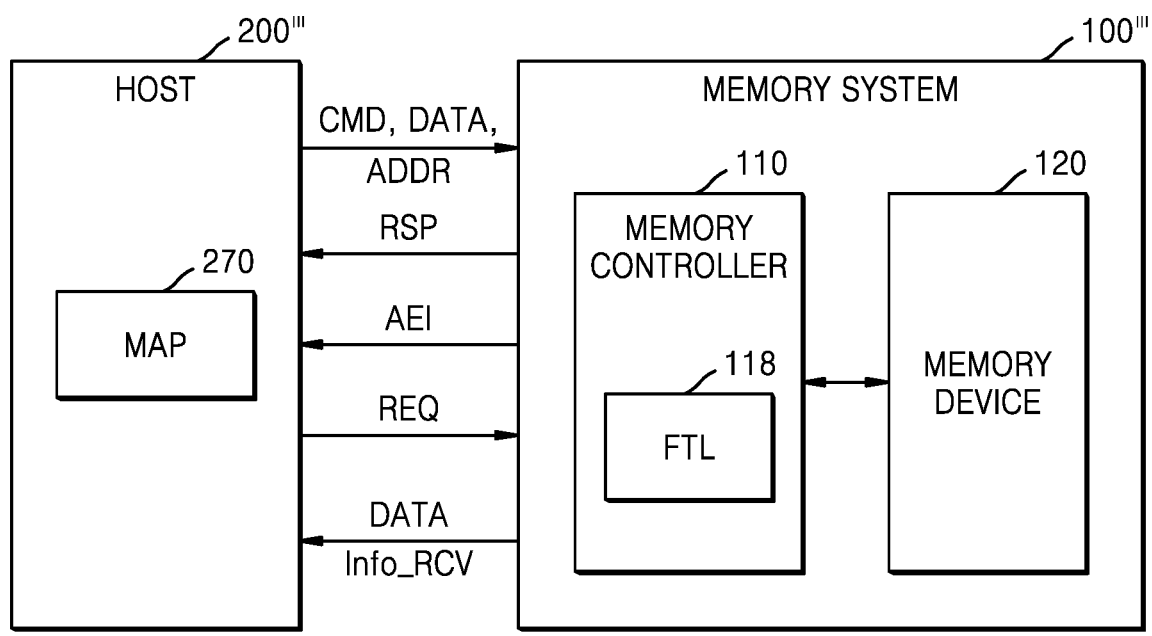
FIG. 14 is a block diagram of a computing system using a Host-aware Performance Booster (HPB) according to an embodiment.

FIG. 14 is a block diagram of a computing system using a Host-aware Performance Booster (HPB) according to an embodiment.

FIG. 14 illustrates a computing system according to a modifiable embodiment. Referring to FIG. 14, a computing system 1000''' may include a memory system 100''' and a host 200'''.

The memory system 100''' may include the memory controller 110 and the memory device 120, and the memory controller 110 may include an FTL 118. In other words, the memory system 100''' may perform an address mapping function through the FTL 118 and thus may correspond to a normal SSD.

The host 200''' of FIG. 14 applies an HPB scheme and does not include an FTL unlike the host 200 of FIG. 2. Therefore, since the host 200''' may not perform an address mapping function, the host 200''' may not directly determine a physical address to store write data and may transmit a write request on the basis of a logical address. Instead, the host 200''' may include mapping information 270 of the memory system 100'''. Therefore, the host 200''' may check a physical address corresponding to the logical address on the basis of mapping information and transmit a read request on the basis of the checked physical address.

Hereinafter, a method of a computing system using an HPB will be described in detail.

Figure 15:
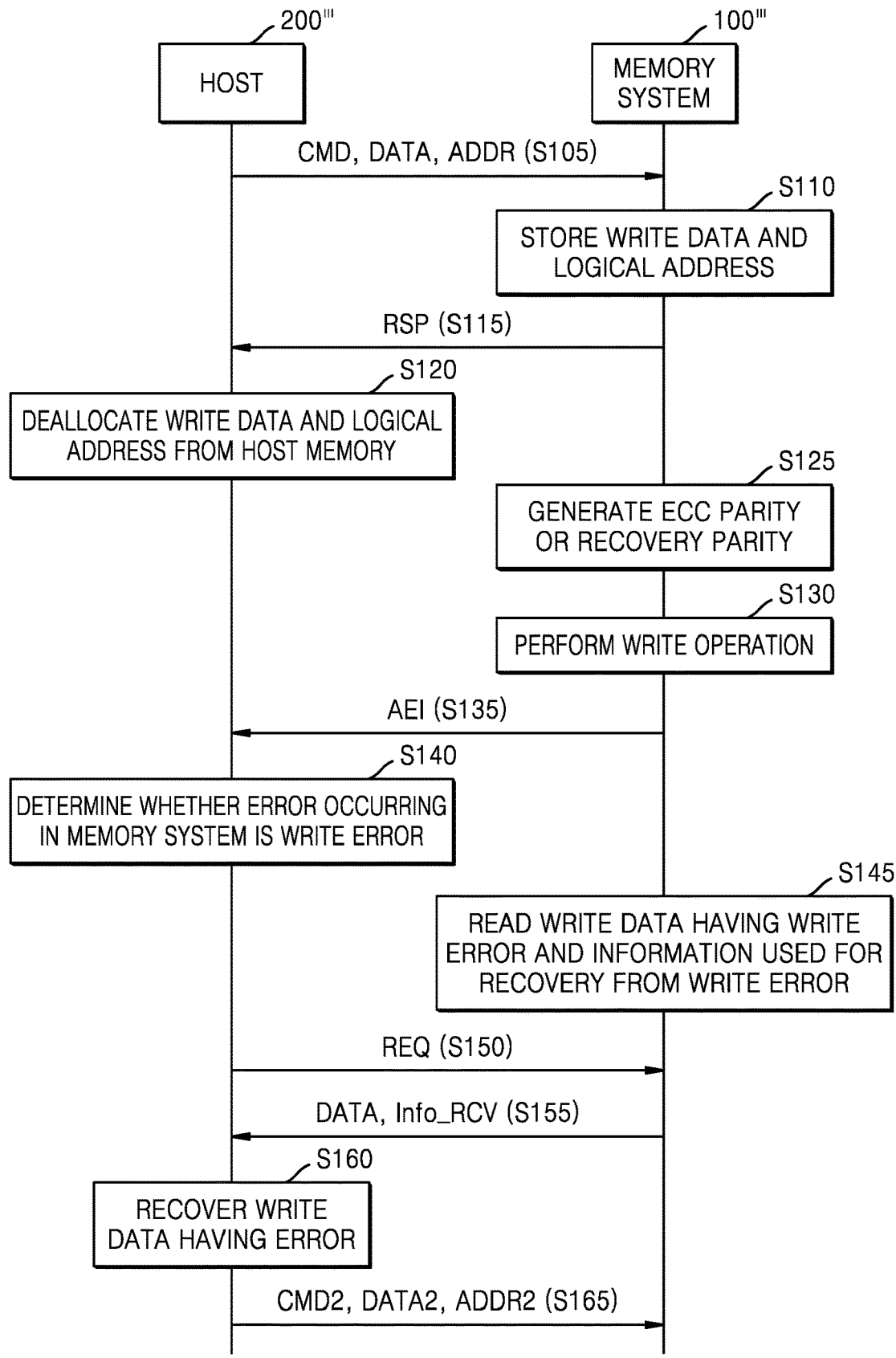
FIG. 15 is a flowchart of a recovering method of a computing system using an HPB according to an embodiment.

FIG. 15 is a flowchart of a recovering method of a computing system using an HPB according to an embodiment.

An operating method according to this embodiment may be performed in the computing system 1000''' of FIG. 14. In operation S105, the host 200''' may transmit a write request to the memory system 100'''. For example, the host 200''' may transmit a write command CMD, write data DATA, and a logical address ADDR. In operation S110, the memory system 100''' may store received write data and logical address in a buffer of the memory system 100'''.

In operation S115, the memory system 100''' may provide the host 200''' with a response signal RSP. In operation S120, the host 200''' may deallocate the write data and the logical address from a host buffer. For example, the host 200''' may deallocate write data and a logical address corresponding to a response signal among a plurality of pieces of write data and a plurality of logical addresses stored in the host buffer.

In operation S125, the memory system 100''' may generate an ECC parity and/or a recovery parity on the basis of the write data. In operation S130, the memory system 100''' may perform a write operation on the generated parity and the write data. For example, the memory system 100''' may check a physical address corresponding to the logical address ADDR and perform a write operation in an area corresponding to the physical address.

In operation S135, when a write error occurs, the memory system 100''' may provide the host 200''' with AEI. In operation S140, the host 200''' may determine whether the error occurring in the memory system 100''' is a write error, on the basis of acquired error occurrence information.

In operation S145, the memory system 100''' may read write data having a write error and information used for a recovery. In operation S150, the host 200''' may request information about an error from the memory system 100'''.

In an embodiment, orders of operations S145 and S150 may be changed. For example, the host 200''' may provide the memory system 100''' with a request signal REQ, and then the memory system 100''' may read write data having a write error and information used for a recovery in response to the request signal REQ. Here, the host 200''' may check a physical address of the information used for the recovery by using directory information of the memory system 100''', and the request signal REQ may include the physical address of the information used for the recovery. Also, the memory system 100''' may read the write data having the write error from a buffer and read the information used for the recovery from the memory device 120 on the basis of the physical address included in the request signal REQ.

In operation S155, the memory system 100''' may provide the host 200''' with read write data DATA and information used for a recovery Info_RCV. In operation S160, the host 200''' may recover the write data having the write error. In operation S165, the host 200''' may transmit a second write request to the memory system 100'''. For example, the host 200''' may transmit a write command CMD2, recovered write data DATA2, and a new physical address ADDR2. Also, when receiving a response signal to the second write request from the memory system 100''', the host 200''' may update mapping information of the memory system 100'''.

As is traditional in the field of the inventive concepts, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The above-described embodiments are all exemplary, and thus, the inventive concept is not limited to the embodiments and may be realized in various other forms. While embodiments have been particularly shown and described, it will be understood that various changes in form and details may be made therein without departing from the spirit and scope of the following claims.

What is claimed is:

1. A method of operating a memory system comprising a memory device, the method comprising:

in response to a write request of a host, storing write data and a physical address received from the host in a buffer;

performing a write operation on the memory device based on the write data and the physical address;

based on a write error corresponding to the write data occurring, asynchronously providing the host with error occurrence information, wherein the error occurrence information is registered in an error processing wait list by the host; and providing the host with the write data having the write error and information used for a recovery from the write error.

2. The method of claim 1, wherein the performing of the write operation comprises:

based on the write data, generating at least one parity comprising at least one of an error correcting code (ECC) parity of the write data or a recovery parity of pieces of write data in a recovery unit corresponding to the write data; and writing the write data and the generated at least one parity.

3. The method of claim 2, wherein the information used for the recovery from the write error comprises at least one of the at least one parity, normal data included in the recovery unit, or management information of the memory system.

4. The method of claim 1, wherein, based on the write error occurring in a data area, the information used for the recovery from the write error comprises metadata corresponding to the write data having the write error.

5. The method of claim 1, wherein the write data having the write error and the information used for the recovery from the write error are provided to the host based on a request for the information used for the recovery from the write error being received from the host.

6. The method of claim 1, wherein the error occurrence information comprises the physical address of the write data having the write error.

7. The method of claim 1, wherein the providing of the host with the write data having the write error and the information used for the recovery from the write error comprises storing the write data having the write error and the information used for the recovery from the write error in one of a controller memory buffer (CMB) included in the memory system or a host memory buffer (HMB) included in the host.

8. The method of claim 7, further comprising providing the host with a return signal based on the storing.

9. A method of operating a host configured to control a memory system, the method comprising:

based on write data and a physical address, transmitting a first write request to the memory system;

asynchronously acquiring, from the memory system, error occurrence information about a write error corresponding to the write data occurring in the memory system;

registering the error occurrence information in an error processing wait list;

acquiring the error occurrence information from the error processing wait list;

acquiring the write data having the write error and information used for a recovery from the write error from the memory system;

based on the write data having the write error and the information used for the recovery from the write error, recovering the write data having the write error; and based on the recovered write data, transmitting a second write request to the memory system.

10. The method of claim 9, wherein the error occurrence information comprises the physical address of the write data having the write error.

11. The method of claim 10, further comprising, based on a plurality of pieces of error occurrence information being acquired, determining, by the host, recovery priorities based on physical addresses included in the plurality of pieces of error occurrence information,
- wherein the acquiring of the write data having the write error and the information used for the recovery from the write error comprises acquiring from the memory system a plurality of pieces of write data having a plurality of write errors, and a plurality of pieces of information used for recoveries from the plurality of write errors, and
- wherein the recovering of the write data having the write error comprises recovering the plurality of pieces of write data having the plurality of write errors based on the plurality of pieces of information used for the recoveries from the plurality of write errors, according to the recovery priorities.

12. The method of claim 10, further comprising, based on a plurality of pieces of error occurrence information being acquired, determining, by the host, recovery priorities based on an acquisition order of the plurality of pieces of error occurrence information,
- wherein the acquiring of the write data having the write error and the information used for the recovery from the write error comprises acquiring from the memory system a plurality of pieces of write data having a plurality of write errors, and a plurality of pieces of information used for recoveries from the plurality of write errors, and
- wherein the recovering of the write data having the write error comprises recovering the plurality of pieces of write data having the plurality of write errors based on the plurality of pieces of information used for the recoveries from the plurality of write errors, according to the recovery priorities.

13. The method of claim 9, wherein the information used for the recovery from the write error comprises at least one of an ECC parity of the write data having the write error, a recovery parity, normal data in a recovery unit corresponding to the write error, or management information of the memory system.

14. The method of claim 9, wherein, based on the write error occurring in a data area, the information used for the recovery from the write error comprises metadata corresponding to the write data having the write error.

15. The method of claim 14, wherein the recovering of the write data having the write error comprises:
- based on the metadata, determining whether to recover the write data having the write error by the host; and
- based on a result the determining, recovering the write data having the write error by the host.

16. The method of claim 15, wherein the determining whether to recover the write data having the write error comprises determining whether to recover the write data having the write error by using validity information included in the metadata.

17. The method of claim 9, wherein the acquiring of the write data having the write error and the information used for the recovery from the write error comprises accessing a controller memory buffer (CMB) included in the memory system, or accessing a host memory buffer (HMB) included in the host.

18. The method of claim 9, wherein the transmitting of the second write request to the memory system comprises determining a new physical address based on mapping information of the memory system, and transmitting the second write request to the memory system based on the new physical address and the recovered write data.

19. A computing system comprising:
- a memory system comprising a memory device; and
- a host configured to transmit a write request to the memory system based on write data and a physical address,
- wherein the memory system, in response to the write request of the host, is configured to:
  - store the write data and the physical address received from the host in a buffer of the memory system,
  - perform a write operation on the memory device based on the write data and the physical address,
  - based on a write error corresponding to the write data occurring, asynchronously provide the host with error occurrence information, and
  - provide the host with the write data having the write error and information used for a recovery from the write error, and
- wherein the host is configured to include an error processing wait list,
- wherein the host is configured to:
  - register the error occurrence information received from the memory system in the error processing wait list;
  - acquiring the error occurrence information from the error processing wait list;
  - recover the write data having the write error based on the write data having the write error and the information used for the recovery from the write error, and
  - transmit a recovery command to the memory system based on the recovered write data.

20. The computing system of claim 19, wherein the memory system, based on storing the write data and the physical address in the buffer of the memory system, is configured to transmit a response signal to the host, and
wherein the host is further configured to:
- allocate a plurality of pieces of write data and a plurality of physical addresses to a buffer of the host, and
- based on receiving the response signal from the memory system, deallocate the write data and the physical address corresponding to the response signal from the buffer of the host.

* * * * *